(12) United States Patent
Na et al.

(10) Patent No.: US 12,133,418 B2
(45) Date of Patent: Oct. 29, 2024

(54) DISPLAY DEVICE

(71) Applicant: LG Display Co., Ltd., Seoul (KR)

(72) Inventors: YunJin Na, Paju-si (KR); Miso Kim, Paju-si (KR); TaeHyun Min, Paju-si (KR); Jiyoon Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 210 days.

(21) Appl. No.: 17/380,950

(22) Filed: Jul. 20, 2021

(65) Prior Publication Data
US 2022/0181417 A1 Jun. 9, 2022

(30) Foreign Application Priority Data

Dec. 8, 2020 (KR) .................. 10-2020-0170760

(51) Int. Cl.
*H10K 59/121* (2023.01)
*H10K 50/844* (2023.01)
*H10K 59/122* (2023.01)

(52) U.S. Cl.
CPC ....... *H10K 59/1213* (2023.02); *H10K 50/844* (2023.02); *H10K 59/122* (2023.02)

(58) Field of Classification Search
CPC ............ H10K 59/1213; H10K 59/122; H10K 59/124; H10K 59/12; H10K 59/131; H10K 59/123; H10K 50/844; H10K 50/8426; H10K 50/8428
See application file for complete search history.

(56) References Cited

U.S. PATENT DOCUMENTS

| | | | |
|---|---|---|---|
| 2016/0315135 A1* | 10/2016 | Choi | H10K 59/122 |
| 2018/0122890 A1* | 5/2018 | Park | H10K 59/1315 |
| 2020/0212356 A1* | 7/2020 | Kim | H10K 59/124 |
| 2020/0328376 A1* | 10/2020 | Seo | H10K 59/122 |

* cited by examiner

*Primary Examiner* — Shaun M Campbell
(74) *Attorney, Agent, or Firm* — Birch, Stewart, Kolasch & Birch, LLP (57) ABSTRACT

A display device according to embodiments of the present disclosure includes at least one groove formed in an organic file disposed on a substrate. As a result, it is possible to discharge, or delay the movement of, moisture generated in a manufacturing process of the display device, or gas remaining in an organic film. Thus the display quality and lifetime of the display device can be improved.

21 Claims, 6 Drawing Sheets

DISPLAY DEVICE

CROSS-REFERENCE TO RELATED APPLICATION

This application claims the priority benefit of Korean Patent Application No. 10-2020-0170760, filed on Dec. 8, 2020 in the Korean Intellectual Property Office, the entire contents of which are incorporated by reference into the present application.

BACKGROUND

Field of the Disclosure

The present disclosure relates to display devices, and more specifically, to a display device for improving the display quality and lifetime of the display device by discharging moisture generated in a manufacturing process or gas remaining in an organic film and/or delaying the movement of such moisture or gas.

Description of the Background

Various schemes and types of display devices have been widely used that display images on TVs, monitors, smartphones, tablet PCs, notebook computers and the like.

Among the display devices, following liquid crystal display (LCD) devices that have been widely used so far, organic light emitting diode (OLED) devices (or organic light emitting display devices) have been increasingly used, and an application range thereof has been widely expanded.

Display devices include a plurality of light emitting elements or liquid crystals to display an image, and a display panel in which a thin film transistor for individually controlling the operation of each light emitting element or liquid crystal is disposed on a substrate. Thereby, such display devices allow the plurality of light emitting elements or the liquid crystals to be operated according to information or data desired to be displayed.

Among the display devices, the organic light emitting display devices that are self-emissive display devices emitting light based on electrical excitation of an organic material can be driven at a low voltage and manufactured to have a relatively thin structure. The organic light emitting display devices have been attracting attention as a display device that is capable of solving the shortcomings of liquid crystal display devices, for example, a wide viewing angle, a short response time, and the like.

In the organic light emitting display device, an emissive layer formed of an organic material is disposed between an anode electrode and a cathode electrode. As positive and negative voltages are applied to the anode electrode and the cathode electrode of the organic light emitting display device, respectively, holes injected from the anode electrode can move to an emissive layer by way of a hole transport layer, and electrons can move to the emissive layer by way of an electron transport layer from the cathode electrode. Thereby, the electrons and the holes can be re-combined in a corresponding light emitting element, which results in the generation of excitons.

As such excitons move from an excited state to a ground state, fluorescent molecules in the emissive layer emit light to form an image. In the case of a full color type organic electroluminescent device, pixels emitting various colors such as red, green, and blue are included.

In order for the organic light emitting display device to form a light-emitting portion, a pixel defining layer is formed on an anode electrode. Thereafter, a part of the pixel defining layer in a region in which a part of the anode electrode is located is removed. Next, an emissive layer is disposed in a region in which the pixel defining layer is removed, and a cathode electrode is disposed on the emissive layer.

SUMMARY OF THE INVENTION

To dispose a light-emitting portion and a thin film transistor in an organic light emitting display device, a plurality of organic films are used and as a result, gas and moisture are generated in a region in which the organic films are disposed in a manufacturing process, and even when the manufacturing of the organic light emitting display device is completed, some of the gas and moisture can remain in the organic light emitting display device. The gas and moisture remaining in the organic light emitting display device can move to an emissive layer formed of an organic material. As a result, the emissive layer can be damaged, and the luminance of the organic light emitting display device can be degraded. This can lead the organic light emitting display device to not completely emit light over time.

Embodiments of the present disclosure relate to an organic light emitting display device that is capable of preventing gas and moisture remaining in the display device from damaging an emissive layer by discharging the gas and moisture or delaying the movement of them to the emissive layer.

Issues or problems solved or addressed by the present disclosure are not limited thereto, and other issues or problems which are or can be addressed by the present disclosure will become apparent to those skilled in the art from the following description.

In accordance with one aspect of the present disclosure, a display device is provided that includes a substrate including an active area in which a plurality of pixels are disposed, and a non-active area surrounding the active area, a thin film transistor disposed on the substrate, a first planarization film disposed on the thin film transistor, a first electrode disposed on the first planarization film and electrically connected to the thin film transistor, and a pixel defining layer disposed on the first electrode. Further, the non-active area can include a first groove corresponding to a first region in which one or more of the pixel defining layer and the first planarization film are partially removed, and a second groove corresponding to a second region in which a part of the pixel defining layer is removed, where the second region is different from the first region.

In accordance with another aspect of the present disclosure, a display device is provided that includes a substrate including an active area in which a plurality of pixels are disposed, and a non-active area surrounding the active area, a thin film transistor disposed on the substrate, a first planarization film disposed on the thin film transistor, a first electrode disposed on the first planarization film and electrically connected to the thin film transistor, a pixel defining layer disposed on the first electrode, an emissive layer disposed to contact a part of each of the first electrode and the pixel defining layer, a second electrode disposed on the emissive layer, a common electrode line for transmitting a common voltage to the second electrode, and a common electrode connection line electrically connecting between the second electrode and the common electrode line. Further, the non-active area can include a first groove corresponding to a first region in which one or more of the pixel defining layer and the first planarization film are partially removed, and the common electrode connection line can include at least one outlet for discharging gas.

In accordance with aspects of the present disclosure, by forming a plurality of grooves for discharging, or delaying the movement of, moisture generated in a manufacturing process of an organic light emitting display device, or gas remaining in an organic film, it is possible to prevent or minimize the gas and moisture from damaging an emissive layer of the display device.

Thus, the display quality and lifetime of the display device can be improved.

Effects according to aspects of the present disclosure are not limited thereto, and other effects will become apparent to those skilled in the art from the following description.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

The advantages and features of the present disclosure and methods of achieving the same will be apparent by referring to embodiments of the present disclosure as described below in detail with reference to the accompanying drawings. However, the present disclosure is not limited to the embodiments set forth below, but can be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description can make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, can be used herein to describe one element or feature's relationship to another element(s) or feature(s) as illustrated in the figures, and it should be interpreted that one or more elements can be further "interposed" between the elements unless the terms such as 'directly', "only" are used.

A location, arrangement, or disposition of a first element or layer "on" a second element or layer can include that not only is the first element or layer located, arranged, or disposed directly on the second element or layer, but a third element or layer is interposed between the first element or layer and the second element or layer.

When the terms, such as "first", "second", or the like, are used herein to describe various elements or components, it should be considered that these elements or components are not limited thereto. These terms are merely used herein for distinguishing an element from other elements and may not define order. Therefore, a first element mentioned below can be a second element in a technical concept of the present disclosure.

Like reference numerals generally denote like elements throughout the present specification.

The size and thickness of each component shown in the drawings are illustrated for convenience of description, and thus, embodiments of the present disclosure are not necessarily limited thereto.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

It should be appreciated that embodiments herein can be applied to not only an organic light emitting display device, buy other various display devices such as a liquid crystal display device, a field emission display device, a quantum dot display device, and the like.

Hereinafter, embodiments of a display device that is capable of improving the display quality and lifetime of the display device by discharging, or delaying the movement of, moisture generated in a manufacturing process of the display device, or gas remaining in an organic film will be discussed in detail with reference to accompanying drawings. All the components of each display device according to all embodiments of the present disclosure are operatively coupled and configured.

Figure 1A:
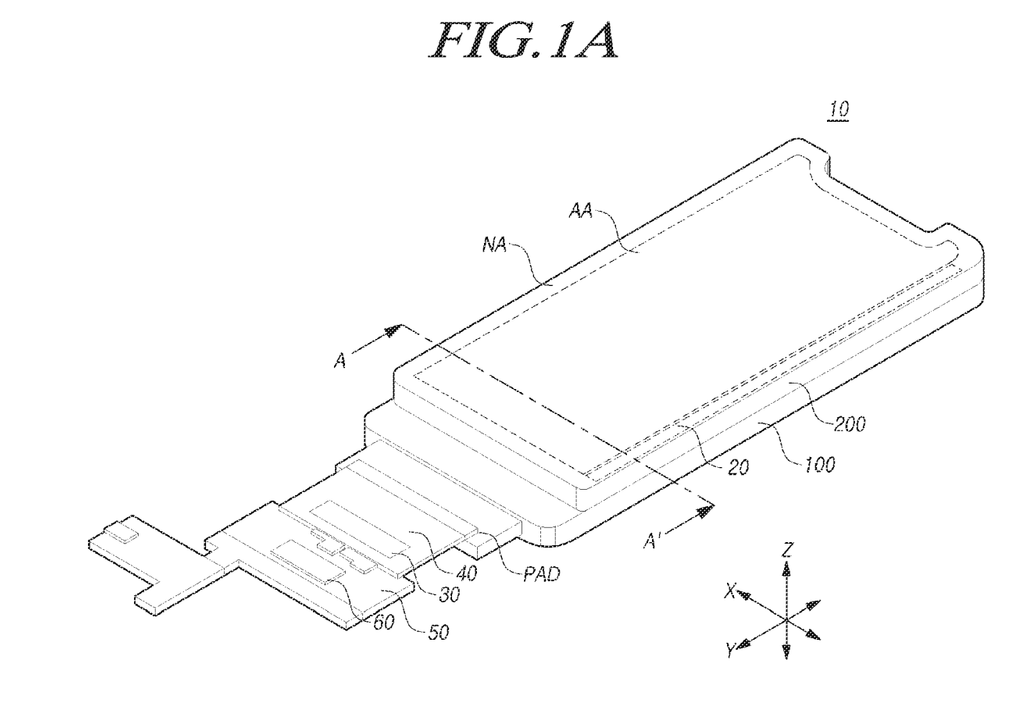
FIG. 1A is a perspective view illustrating a display.

FIG. 1A is a perspective view illustrating a display device 10.

Referring to FIG. 1A, the display device 10 includes a substrate 100, and a front member 200 disposed on the substrate 100. The substrate 100 can include a front portion FP and a pad portion PAD extending from a lower portion of the front portion FP.

To display images and control the display of images, some elements, such as a light emitting element layer, a thin film transistor layer for driving the light emitting element layer, and the like can be disposed between the substrate 100 and the front member 200. The elements, such as the light emitting element layer, the thin film transistor layer for driving the light emitting element layer, and the like disposed between the substrate 100 and the front member 200 for displaying images will be described later.

The light emitting element layer is located in the front portion FP of the substrate 100, and the front portion FP can be divided into an active area AA in which images are displayed, and a non-active area NA that is an area other than the active area AA. The non-active area NA is an area in which the light emitting element layer is not located, and corresponds to an area surrounding the active area AA. For example, active area AA may be a display area or a first area, embodiments of the present disclosure are not limited thereto. For example, a non-active area NA may be a non-display area or a second area, embodiments of the present disclosure are not limited thereto.

One or more driving members for applying signals from the outside to the display device 10, for example, a driving chip, a flexible printed circuit board (FPCB), or the like can be mounted on the pad portion PAD.

The substrate 100 can be formed of a plastic material having flexibility and can have a flexible characteristic. The substrate 100 can include polyimide, and can be formed of a thin glass material having flexibility.

Left-side and right-side edges of the front portion FP can be bent downward as the substrate 100 has a characteristic of flexibility. When the left-side and right-side edges of the front portion FP are bent downward, as portions of the non-active area corresponding to the left-side and right-side edges of the front portion FP are located to face respective side surfaces of the substrate 100, it is possible to cause an area of the non-active area NA being perceived from a user located in front (Z axis) of the display device to be reduced. Further, when the pad portion PAD located in a lower portion of the substrate 100 is bent, the pad portion PAD can be located to face the rear surface of the substrate 100; thus, a portion of the non-active area NA corresponding to the lower portion of the substrate 100 can be reduced.

Meanwhile, since the front member 200 overlaps with the active area AA in which images are displayed, in order for images to be visible, the front member 200 can be formed of a transparent material, such as a cover glass, or the like. For example, the front member 200 can be formed of a transparent plastic material, a glass material, or a reinforced glass material.

Figure 1B:
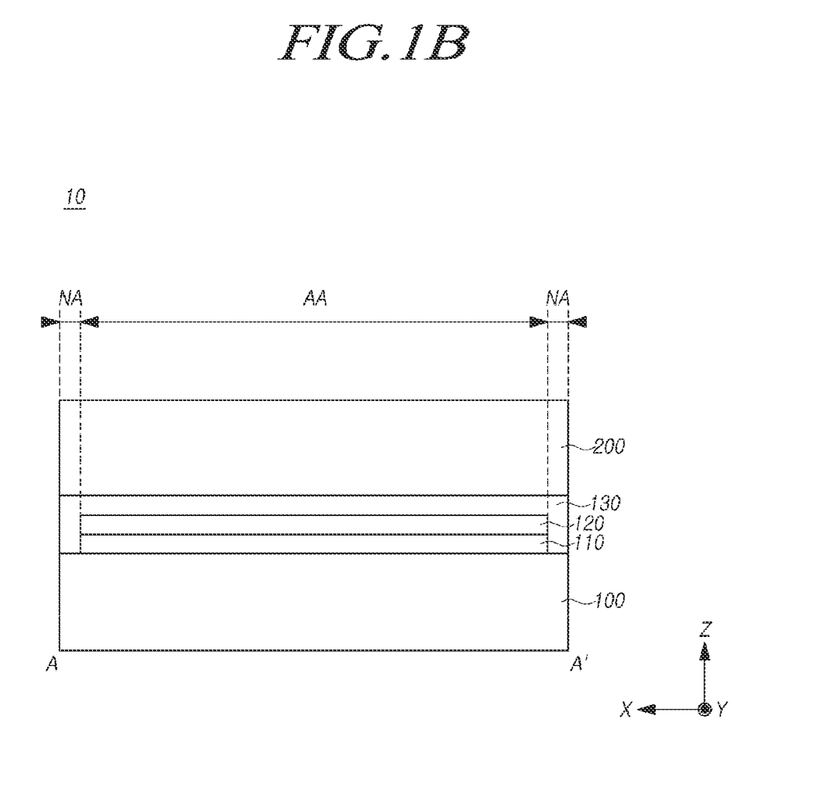
FIG. 1B is a cross-sectional view taken along with line A-A' of FIG. 1A.

FIG. 1B is a cross-sectional view taken along with line A-A' of FIG. 1A. Particularly, FIG. 1B is a cross-sectional view for approximately illustrating a portion of a panel, and represents some elements, such as the thin film transistor layer, the light emitting element layer, and the like located between the substrate 100 and the front member 200.

Referring to FIGS. 1A and 1, the thin film transistor layer 110 is disposed on the substrate 100. The thin film transistor layer 110 can include gate lines, data lines, and at least one thin film transistor. The thin film transistor includes a gate electrode, a semiconductor layer, and source and drain electrodes. When a gate driver 20 generating a gate signal and applying the gate signal to the gate electrode is formed in a gate-driver-in-panel (GIP) scheme, the gate driver 20 can be formed together with the thin film transistor layer 110.

The light emitting element layer 120 can be disposed on the thin film transistor layer 110. The light emitting element layer 120 can include an anode electrode that is a first electrode, a light emitting organic material layer, a cathode electrode that is a second electrode, and a pixel defining layer. The light emitting organic material layer can include a hole transporting layer, an emissive layer, and an electron transporting layer. In this instance, when voltage are applied to the first and second electrodes, holes and electrons can move to the emissive layer through the hole transporting layer and the electron transporting layer, respectively, and combine to emit light in the emissive layer. As a pixel is disposed in a region in which the light emitting element layer 120 is disposed, therefore, the region in which the light emitting element layer 120 is disposed can be the active area AA. An area near, or surrounding, the active area AA can be the non-display area NA.

An encapsulation layer 130 is disposed on the light emitting element layer 120. The encapsulation layer 130 serves to prevent oxygen or moisture from penetrating to the light emitting element layer 120. The encapsulation layer 130 can include at least one organic film and at least one inorganic film.

A thin film transistor is used to drive and control each of the pixels disposed in the light emitting element layer 120. A gate signal through a gate line is applied to a gate electrode of the thin film transistor, and as a data voltage through a data line is applied to a source electrode and a drain electrode, a corresponding current can be applied to an anode electrode that is a first electrode of the light emitting element layer 120. Thus, an emissive layer of each pixel can emit light at a predetermined brightness depending on a predetermined current.

The driving of at least one pixel disposed in the active area AA of the substrate 100 can be controlled by at least one signal provided from the gate driver 20, and at least one signal provided from a data driver 30. The pixel can be a region in which an emissive layer emits light or a region in which a thin film transistor and the emissive layer are disposed.

The gate driver 20 can provide gate signals to gate lines according to a gate control signal input from a timing controller 60. The gate driver 20 can be implemented in the gate-driver-in-panel (GIP) scheme in a portion, or portions, of the non-active area NA corresponding to one or two edges, or both lateral edges, of the active area AA of the substrate 100. In another embodiment, the gate driver 20 can be implemented as a gate driving chip, and attached to the pad portion PAD of the substrate 100.

A data driver 30 receives digital video/image data and source control signals from the timing controller 60. The data driver 30 converts the digital video/image data to analogue data voltages according to source control signals, and then outputs the converted data voltages to data lines. When the data driver 30 is implemented as a data driving chip, the data driver of this type can be mounted on a flexible printed circuit board 40 in a chip-on-film (COF) scheme or a chip-on-panel (COP) scheme.

The flexible printed circuit board 40 can be mounted on, and electrically connected to, the pad portion PAD of the substrate 100 using an anisotropic conducting film.

Further, a circuit board 50 can be attached to the flexible printed circuit board 40. A plurality of circuits implemented as respective driving chips can be mounted on the circuit board 50. For example, the timing controller 60 can be mounted on the circuit board 50. The circuit board 50 can be a printed circuit board (PCB) or a flexible printed circuit board (FPCB).

The timing controller 60 receives digital video/image data and timing signals from an external system board through a cable of the circuit board 50. The timing controller 60 generates gate control signals for controlling operation times of the gate driver 20 based on timing signals, and data control signals for controlling the data driver 30. The timing controller 60 provides gate control signals and data control signals to the gate driver 20 and the data driver 30, respectively.

Figure 2:
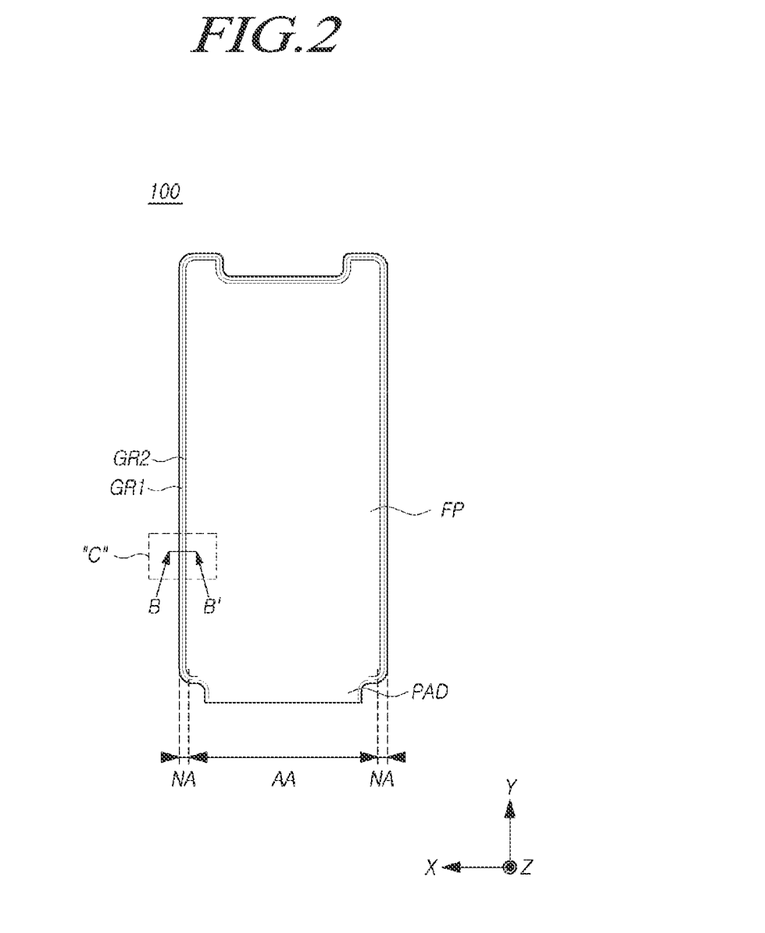
FIG. 2 is a plan view illustrating a substrate according to aspects of the present disclosure.

FIG. 2 is a plan view illustrating a substrate according to aspects of the present disclosure.

Referring to FIG. 2, a first groove GR1 and a second groove GR2 formed by partially removing at least one of a planarization layer and a pixel defining layer can be disposed in a non-active area NA of the substrate 100 according to aspects of the present disclosure.

The first groove GR1 and the second groove GR2 can be formed along an outer edge of the substrate 100 in the non-active area NA, and formed in an upper edge, a left-side edge, and a right-side edge of the substrate 100. Thereby, it is possible to discharge, or delay the movement of, gas and moisture still remaining after a corresponding manufacturing process is completed. In another embodiment, the first groove GR1 and the second groove GR2 can be formed in a lower portion such as a bottom edge of the substrate 100, and in this instance, when the pad portion PAD is located in the lower portion of the substrate, multiple lines for delivering various driving signals can be densely located in the pad portion PAD. Because of this, when a part of the planarization layer for forming grooves is removed, there is a probability that the lines can be exposed. Thus, the first groove GR1 and the second groove GR2 can be formed taking account of configurations of components or elements such as the lines densely located in the pad portion PAD, or may not be formed in the lower portion of the substrate 100.

The first groove GR1 and the second groove GR2 can be formed for discharging, to the outside, gas GAS generated when heat is applied to an organic film such as the planarization layer during a manufacturing process of the display device 10, and/or moisture generated due to a sudden temperature difference during the manufacturing process, or for delaying the movement of the gas GAS and/or the moisture to an emissive layer.

When such gas or moisture inside of the display device 10 is not discharged, or the movement of the gas or moisture is not delayed, a corresponding light emitting organic material layer can be degraded or damaged, and thereby, a phenomenon in which pixels are shrunk can occur. When the phenomenon in which pixels are shrunk occurs, since the brightness of the display device 10 can become poor, and the pixels cannot fully emit light over time. It is therefore necessary to provide a configuration for removing or reducing gas or moisture inside of the display device 10.

Figure 3:
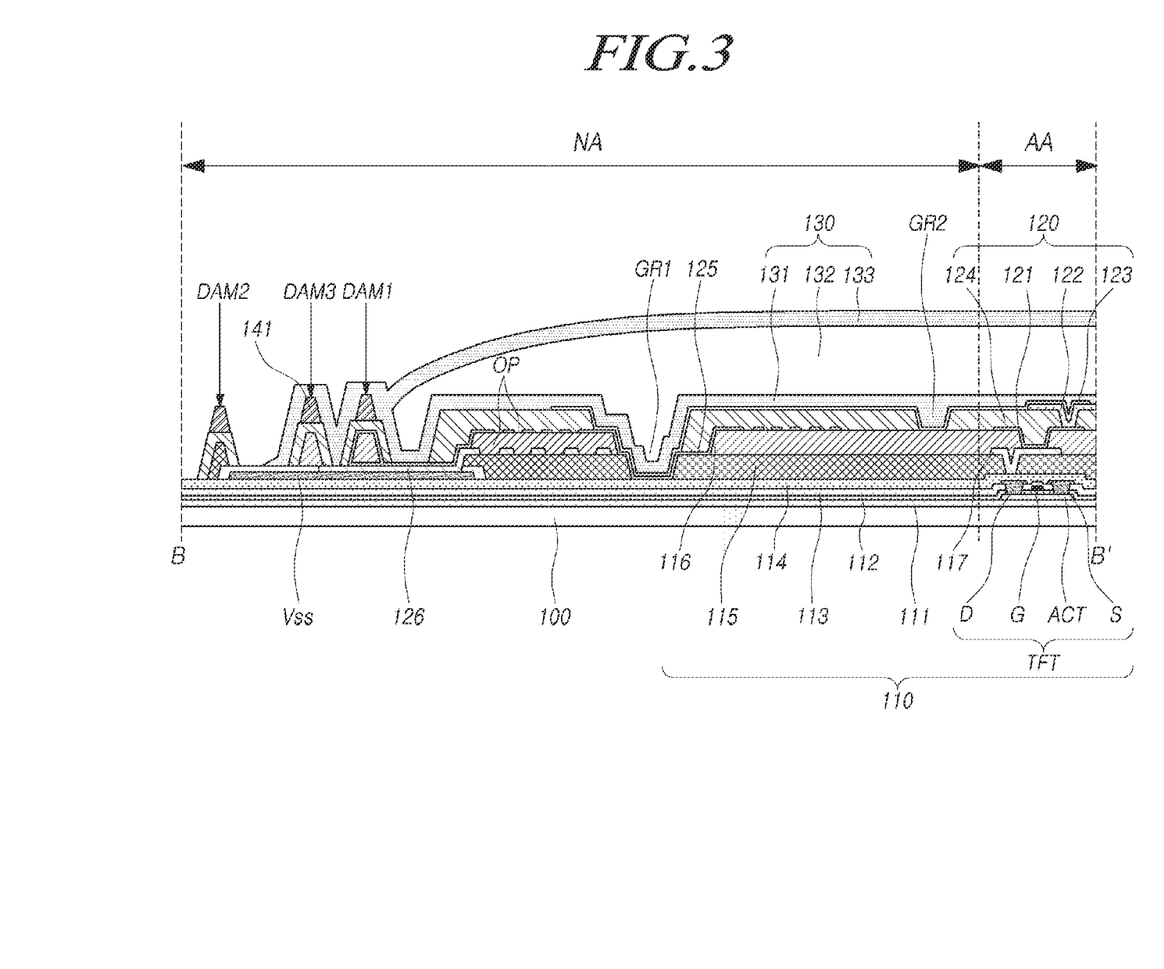
FIG. 3 is a cross-sectional view taken along with line B-B' of FIG. 2.

FIG. 3 is a cross-sectional view taken along with line B-B' of FIG. 2. Particularly, FIG. 3 is a cross-sectional view of the display device including the first groove GR1 and the second groove GR2. A thin film transistor layer 110, a light emitting element layer 120, and an encapsulation layer 130 are disposed in the active area AA of the substrate 100.

Referring to FIG. 3, the thin film transistor layer 110 includes a thin film transistor TFT, a gate insulating film 112, an interlayer insulating film 113, a protective film 114 and a first planarization film 116.

Hereinafter, a detailed configuration of the thin film transistor layer 110 will be discussed.

A buffer film 111 is disposed on the substrate 100. The buffer film 111 is disposed on the substrate 100 to protect thin film transistors TFT and light emitting devices from moisture penetrating through the substrate 100 that is vulnerable to moisture permeation. The buffer film 111 can be made up of a plurality of inorganic films that are alternately stacked. For example, the buffer film 111 can be made up of multiple films in which one or more inorganic films among a silicon oxide layer (SiOx), a silicon nitride layer (SiNx), and SiON are alternately stacked; however, embodiments of the present disclosure are not limited thereto.

A thin film transistor TFT is disposed on the buffer film 111. The thin film transistor TFT includes an active layer ACT, a gate electrode G, a source electrode S and a drain electrode D. FIG. 3 illustrates a top gate type of thin film transistor in which the gate electrode G is located over the active layer ACT; however, embodiments of the present disclosure are not limited thereto. For example, the thin film transistor TFT can be formed in a bottom gate type in which the gate electrode G is located under the active layer ACT, and in a double gate type in which respective gate electrodes G are located over and under the active layer ACT.

The active layer ACT is disposed on the buffer film 111. The active layer ACT can be formed of a silicon-based semiconductor material or an oxide-based semiconductor material. A light blocking layer for blocking external light incident on the active layer ACT can be disposed between the buffer film 111 and the active layer ACT.

The gate insulating film 112 can be disposed on the active layer ACT. The gate insulating film 112 can be made up of an inorganic film, such as a silicon oxide film (SiOx), or a silicon nitride film (SiNx), or multiple layers thereof; however, embodiments of the present disclosure are not limited thereto.

The gate electrode G and a gate line can be disposed on the gate insulating film 112. The gate electrode (G) and the gate line can be disposed as a single layer or multiple layers made up of any one, or an alloy of two or more, of molybdenum (Mo), aluminum (Al), chromium (Cr), gold (Au), titanium (Ti), nickel (Ni), neodymium (Nd), and copper (Cu); however, embodiments of the present disclosure are not limited thereto.

The interlayer insulating film 113 can be disposed on the gate electrode (G) and the gate line. The interlayer insulating film 113 can be made up of an inorganic film, such as a silicon oxide film (SiOx), or a silicon nitride film (SiNx), or multiple layers thereof, however, embodiments of the present disclosure are not limited thereto.

The source electrode S, the drain electrode D, and a data line can be disposed on the interlayer insulating film 113. Each of the source electrode S and the drain electrode D can contact the active layer ACT through an access hole formed by partially removing one or more of the gate insulating film 112 and the interlayer insulating film 113. The source electrode S, the drain electrode D, and the data line can be disposed as a single layer or multiple layers formed of any one, or an alloy of two or more, of molybdenum (Mo), aluminum (Al), chromium (Cr), gold (Au), titanium (Ti), nickel (Ni), neodymium (Nd), and copper (Cu); however, embodiments of the present disclosure are not limited thereto.

For insulating from the thin film transistor TFT, a protective film 114 can be disposed on the source electrode S, the drain electrode D, and the data line. The protective film 114 can be made up of an inorganic film, such as a silicon oxide film (SiOx), or a silicon nitride film (SiNx), or multiple layers thereof; however, embodiments of the present disclosure are not limited thereto.

A first planarization film 116 can be disposed on the protective film 114 to flatten a step caused by the thin film transistor TFT. The first planarization film 116 can be made up of an organic film such as acrylic resin, polyimide resin, epoxy resin, phenolic resin, and polyamide resin.

A second planarization film 115 can be disposed beneath the first planarization film 116 when desired. The second planarization film 115 can be made up of an organic film formed of a material identical to, or different from, the first planarization film 116, and a separation distance between a light emitting element layer 120 disposed on the second planarization film 115 and the thin film transistor TFT can be increased. As the separation distance between the light emitting element layer 120 and the thin film transistor TFT is increased, it is possible to prevent signal interference that can occur between a signal of an electrode included in the light emitting element layer 120 and a signal of the thin film transistor TFT.

The second planarization film 115 can be optionally disposed when desired. Hereinafter, discussions are given on a structure in which the second planarization film 115 is disposed, however, embodiments of the present disclosure are also applicable to a structure in which the second planarization film 115 is not disposed. Accordingly, the second planarization film 115 described herein can represent the first planarization film 116 in the structure where the second planarization film 115 is not included.

The light emitting element layer 120 can be disposed on the first planarization film 116. The light emitting element layer 120 includes a first electrode that is an anode electrode 121, a light emitting organic material layer 122, and a second electrode that is a cathode electrode 123, and a pixel defining layer 124. In another example, the first electrode 121 can become the cathode electrode, and the second electrode 123 can become the anode electrode.

The first electrode 121 can be disposed in a pixel in the active area AA. A common electrode connection line 125 can be disposed to have the same material as the first electrode 121 in the non-active area NA. The common electrode connection line 125 is disposed to be spaced apart from the first electrode 121 and disposed on the same layer as the first electrode 121. The common electrode connection line 125 serves to connect between a common electrode line Vss and the second electrode 123. The common electrode connection line 125 can extend up to the first planarization film 116 and a dam DAM; however, embodiments of the present disclosure are not limited thereto. The common electrode connection line 125 can connected to the common electrode line Vss disposed on a lateral surface of the substrate 100 through a common electrode connection electrode 126. The common electrode connection electrode 126 can be disposed on the same layer as the source electrode S and formed of the same material as the source electrode S.

The first electrode 121 can contact the source electrode S of the thin film transistor TFT through the protective film 114, the first planarization film 116, and an anode connection electrode 117 formed in an access hole formed by removing a part of the second planarization film 115. The first electrode 121 can be formed of a metal material with high reflectivity, such as a stacked structure of aluminum and titanium (Ti/Al/Ti), a stacked structure of aluminum and ITO (ITO/Al/ITO), an APC alloy, and a stacked structure of an APC alloy and ITO (ITO/APC/ITO). The APC alloy can be an alloy of silver (Ag), palladium (Pd), and copper (Cu).

The pixel defining layer 124 can be disposed on the first planarization film 116 and the first electrode 121 in the active area AA, and disposed on the first planarization film 116 and the common electrode connection line 125 in the non-active area NA.

For defining pixels, the pixel defining layer 124 disposed in the active area AA can be disposed to cover an edge of the first electrode 121 on the first planarization film 116.

The pixel defining layer 124 disposed in the non-active area NA can be disposed for protecting the common electrode connection line 125 and flattening the non-active area NA.

The pixel defining layer 124 can be made up of an organic film such as acrylic resin, polyimide resin, epoxy resin, phenolic resin, and polyamide resin; however, embodiments of the present disclosure are not limited thereto.

The first groove GR1 and the second groove GR2 can be formed in the non-active area NA. The first groove GR1 and the second groove GR2 can be formed for discharging, or delaying the movement of, gas caused by applied heat after an organic film, such as the first planarization film 116, the second planarization film 115, the pixel defining layer 124, and the like is deposited.

Further, the first and second grooves GR1 and GR2 can be formed for discharging, or delaying the movement of, moisture generated after the common electrode connection line 125 is disposed on the first planarization film 116, and a cleaning process and a curing process are performed for removing impurities.

In this instance, the moisture can be adsorbed on the surface of the common electrode connection line 125 as a temperature of the substrate decreases during a room temperature waiting time for depositing the pixel defining layer 124 after the curing process is performed. The curing process is a process of applying high temperature heat to the substrate on which the common electrode connection line 125 is disposed for removing moisture remaining on the substrate and gas remaining in an organic film.

As described above, gas or moisture generated in a process of manufacturing the display device 10 can move to the active area AA along an interface, or a surface, of one or more of the pixel defining layer 124, the first planarization film 116, and the second planarization film 115. Such gas or moisture reaching the active area AA can damage the light emitting organic material layer 122, and this can lead to a pixel shrinkage in which an emissive layer is shrunk. When the emissive layer is shrunk, luminance thereof can decrease, and thus, the emission layer cannot fully emit desired light over time.

For discharging gas or moisture generated during a manufacturing process, one or more grooves can be formed by partially removing one or more of the first planarization film 116, the second planarization film 115, and the pixel defining layer 124.

Further, an opening pattern for discharging gas or moisture can be formed by removing a part of the common electrode connection line 125.

Figure 4:
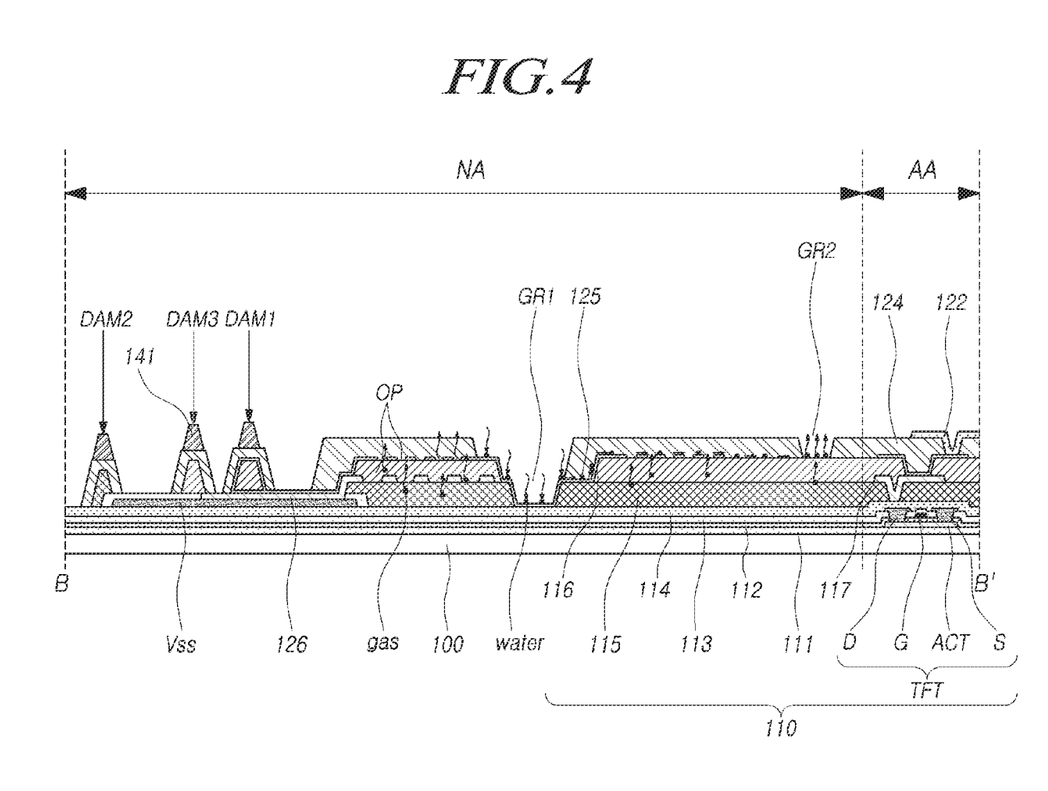
FIG. 4 illustrates traveling paths through which gas or moisture travels according to an example of the present disclosure.

FIG. 4 illustrates traveling paths of gas or moisture generated after the pixel defining layer is disposed.

Figure 5:
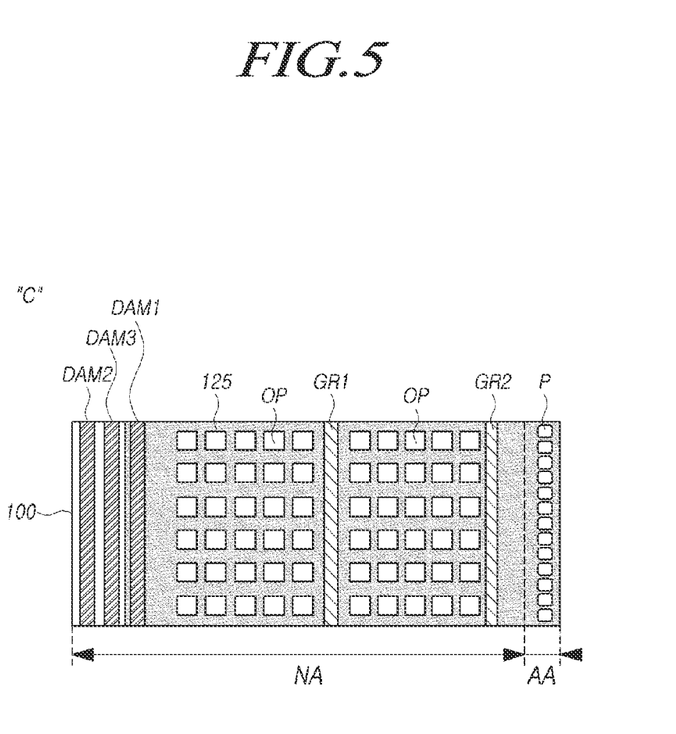
FIG. 5 is an expanded plan view illustrating a "C" area of FIG. 2.

FIG. 5 is an expanded plan view illustrating a "C" area of FIG. 2, and shows the first groove, the second groove, and at least one outlet.

Referring to FIG. 4, gas generated from the first planarization film 116 or the second planarization film 115, which is an organic film, can move upwards or sidewards. In this instance, as the common electrode connection line 125 or the common electrode connection electrode 126 covers the first planarization film 116 or the second planarization film 115, which is a traveling path of the gas, thus, such gas cannot be discharged to the outside. Accordingly, for discharging such gas generated in an organic film, one or more outlets that are openings OP allowing such gas to be discharged can be formed in the common electrode connection line 125 or the common electrode connection electrode 126 disposed on the first planarization film 116 or the second planarization film 115.

The outlets formed in the common electrode connection line 125 or the common electrode connection electrode 126 can be disposed to have an equal opening shape while being spaced apart by a predetermined distance from one another.

For example, such outlets can be a plurality of outlets OP each arranged in a predetermined distance from one another in the common electrode connection line 125 of FIG. 5. The outlets can have various shapes such as a square shape, a circular shape, a triangular shape, or the like; however, embodiments of the present disclosure are not limited thereto. As the common electrode connection line 125 is disposed in the entire of the non-active area NA, thus, the outlets OP that can be disposed in the entire of the non-active area NA lead gas generated from the first planarization film 116 or the second planarization film 115 to be discharged.

Referring to FIGS. 3 and 5, the first groove GR1 can be formed between multiple outlets OP. The first groove GR1 can be a groove formed in a partial region on, or over, the thin film transistor TFT by partially removing all, or one or more, of the first planarization film 116, the second planarization film 115, and the pixel defining layer 124, each of which is an organic film. As a result, the first groove GR1 can prevent the movement of gas generated from an organic film to the light emitting organic material layer 122 by being formed to disconnect an organic film continually formed in the non-active area NA along a middle portion (or line) or a predetermined portion (or line) thereof. For example, gas generated from a left-side organic film of the first groove GR1 with respect to a left-side edge, or a left-side portion (or line), of the substrate 100 can be prevented from moving toward a right-side organic film of the first groove GR1.

As a part of the first planarization film 116, or a part of the first and second planarization films 116 and 115 is removed, the resulted first groove GR1 is formed such that a lateral surface thereof corresponding to the removed part is exposed to the outside. Therefore, it is possible to prevent gas or moisture in an organic film from moving in the horizontal direction.

Further, as the common electrode connection line 125 is disposed on such a part in which the first and second planarization films 116 and 115 are removed, it is possible further prevent gas or moisture generated in an organic film from moving rightwards.

As the first groove GR1 can be a groove formed by partially removing one or more of the first planarization film 116, the second planarization film 115, and the pixel defining layer 124, each of which is an organic film, the first groove GR1 can be formed by removing a desired part, or at least a part, of one or more organic films disposed on, or over, the thin film transistor TFT.

The second groove GR2 can be formed in a right-side edge of the common electrode connection line 125 or an outer edge of the non-active area NA. In a similar manner to the first groove GR1, the second groove GR2 can be formed for discharging gas generated in an organic film, or preventing or delaying the movement of moisture absorbed on the common electrode connection line 125 located in the first groove GR1 to the light emitting organic material layer 122 along the common electrode connection line 125.

Since the second groove GR2 is formed to prevent or delay the movement of moisture generated in the first groove GR1 to the light emitting organic material layer 122, the second groove GR2 is disposed to be closer to the active area AA in which the light emitting organic material layer 122 is located than the first groove GR1. The second groove GR2 can be disposed between the light emitting organic material layer 122 and the common electrode connection line 125, which are traveling paths of moisture.

As described above, as moisture reaching the light emitting organic material layer 122 can cause the pixel shrinkage by damaging the light emitting organic material layer 122 and thus, it can be necessary to prevent the moisture from contacting the light emitting organic material layer 122.

In a similar manner to the first groove GR1, the second groove GR2 can be formed by partially removing one or more of the first planarization film 116, the second planarization film 115, and the pixel defining layer 124, each of which is an organic film. For example, as shown in FIG. 4, the second groove GR2 can be formed by removing a part of the pixel defining layer 124. When the second groove GR2 is formed by removing a part of the pixel defining layer 124, as a part of the top surface of the first planarization film 116 is exposed, moisture moving between the pixel defining layer 124 and the second planarization film 115 can be discharged to the outside, or gas generated between the first and second planarization films 116 and 115 can be discharged to the outside.

After the second electrode 123 is disposed, the movement of the moisture to the light emitting organic material layer 122 can be minimized by delaying the movement of moisture located between the pixel defining layer 124 and the first planarization film 116.

As another example, the second groove GR2 can be formed by partially removing one or more of the pixel defining layer 124 and the first planarization film 116, or partially removing one or more of the pixel defining layer 124, the first planarization film 116, and the second planarization film 115. When the second groove GR2 is formed by partially removing the pixel defining layer 124, the first planarization film 116, and the second planarization film 115, gas generated in the first planarization film 116 and the second planarization film 115 can be discharged from lateral surfaces of the second groove GR2. Accordingly, this leads moisture and gas to be more effectively discharged to the outside, and leads movement of moisture to the light emitting organic material layer 122 to be more effectively delayed, comparing with a situation where only a part of the pixel defining layer 124 is removed.

However, in a situation where multiple organic films (or layers) are partially removed to form the first or second groove GR1 or GR2, as the rigidity of the display device 10 can be weakened, the display device 10 can be therefore damaged when the display device 10 is bent. Thus, it can be necessary to determine whether to partially remove all, or one or more, of one or more organic films (or layers) considering characteristics of each display device or display panel, and the first groove GR1 and the second groove GR2 can be formed to have respective depths different from each other.

For example, for the removing of an optimized level of one or more organic films (or layers), the first groove GR1 is mainly formed for the purpose of discharging gas generated in one or more organic films, by partially removing the pixel defining layer 124, the first planarization film 116, and the second planarization film 115, and the second groove GR2 is mainly formed for the purpose of discharging, or delaying the movement of, moisture moving to the light emitting organic material layer 122 by partially removing the pixel defining layer 124.

The light emitting organic material layer 122 can be disposed on the pixel defining layer 124. The light emitting organic material layer 122 can be disposed on the first electrode 121 which is exposed by a partial removal of the pixel defining layer in the active area AA, and disposed on at least a part of the partially removed region and a region adjacent to the partially removed region.

The light emitting organic material layer 122 can include a hole transporting layer, an emissive layer, and an electron transporting layer. In this instance, when voltage are applied to the first and second electrodes 121 and 123, holes and electrons can move to the emissive layer through the hole transporting layer and the electron transporting layer, respectively, and combine to emit light in the emissive layer.

The light emitting organic material layer 122 can be one of a red light emitting organic material layer that emits red light, a green light emitting organic material layer that emits green light, and a blue light emitting organic material layer that emits blue light. The light emitting organic material layer 122 can be disposed in a region corresponding to the first electrode 121. Further, the light emitting organic material layer 122 can be a white light emitting organic material layer that emits white light. In this instance, the light emitting organic material layer 122 can be disposed to cover the first electrode 121 and the pixel defining layer 124, and a color filter can be disposed in a predetermined region over the substrate 100.

The second electrode 123 can be disposed on the light emitting organic material layer 122 and the pixel defining layer 124. When the display device 10 has a top emission structure, the second electrode 123 can be formed of a transparent conductive material (TCO) such as ITO, IZO, or the like through which light can transmit, or a semi-transmissive conductive material such as magnesium (Mg), silver (Ag), or an alloy of magnesium (Mg) and silver (Ag).

Meanwhile, in an edge of the non-active area NA, the common electrode line Vss disposed in the same layer, and formed of the same material, as the source electrode S can be disposed in an edge of the substrate 100. The common electrode line Vss is a line for applying a common voltage such as a low voltage or a ground voltage to an anode or the second electrode 123, and the common electrode connection electrode 126 and the common electrode connection line 125 for connecting between the common electrode line Vss and the second electrode 123 can be disposed between the common electrode line Vss and the second electrode 123.

The common electrode connection electrode 126 can be disposed in the same layer, and formed of the same material, as the anode connection electrode 117. For example, the common electrode connection electrode 126 can directly contact the common electrode line Vss, extend along lateral and upper outer edges of the first planarization film 116, and extend up to a predetermined length of the upper outer edge of the first planarization film 116. As described above, the common electrode connection electrode 126 can include a plurality of outlets, which are openings for discharging gas generated in one or more organic films.

The common electrode connection line 125 disposed in the same layer, and formed of the same material, as the first electrode 121 can directly contact the common electrode connection electrode 126, for example, an upper portion of the common electrode connection electrode 126. The common electrode connection line 125 can be located in the first groove GR1, extend along respective outer edges of the first and second planarization films 116 and 115, and extend up to a predetermined length of an upper outer edge of the first planarization film 116. The common electrode connection line 125 can contact the second electrode 123 in the first groove GR1. The common electrode connection line 125 can also include a plurality of outlets, which are openings for discharging gas generated in one or more organic films.

Further, the second electrode 123 can contact the light emitting organic material layer 122 in the active area AA, extend along an outer edge of the pixel defining layer 124, contact the common electrode connection line 125 in the first groove GR1, and extend up to one side, for example, a left side, of the first groove GR1 and a region of the pixel defining layer 124 adjacent to the one side of the first groove GR1.

A capping layer can be disposed on the second electrode 123.

The encapsulation layer 130 can be disposed on the light emitting element layer 120, and disposed to extend up to the non-active area NA of the substrate 100, as well as the active area AA.

The encapsulation layer 130 is disposed to cover the active area AA over the pixel defining layer 124, and serves to prevent oxygen or moisture from penetrating to the light emitting organic material layer 122 and the second electrode 123. To do this, the encapsulation layer 130 can include at least one inorganic film and at least one organic film. For example, the encapsulation layer 130 can include a first inorganic film 131, an organic film 132, and a second inorganic film 133.

The first inorganic film 131 of the encapsulation layer 130 can be disposed on the second electrode 123. The first inorganic film 131 can be disposed to cover the second electrode 123. For example, the first inorganic film 131 can be disposed to cover the second electrode 123 in the active area AA and the pixel defining layer 124 in the active area AA, and extend up to the non-active area NA to cover the common electrode connection line 125, the pixel defining layer 124 and the dam DAM in the non-active area NA, and the like. The first inorganic film 131 can be disposed to cover the first groove GR1 and the second groove GR2.

The first inorganic film 131 can have at least one step according to a stacked structure or shape disposed under the first inorganic film 131, and there is a probability that a defect in which the first inorganic film 131 is not disposed in the stepped region can occur. In order to compensate for defects and steps that can occur in the first inorganic film 131, the organic film 132 of the encapsulation layer 130 can be disposed on the first inorganic film 131. The organic film 132 can prevent foreign substances from entering the light emitting organic material layer 122 and the second electrode 123, and be disposed to have a sufficient thickness to compensate for a step difference.

The second inorganic film 133 of the encapsulation layer 130 can be disposed on the organic film 132. The second inorganic film 133 can be disposed to cover the organic film 132. For example, the second inorganic film 133 can be disposed to cover the organic film 132 in the active area AA, and extend up to the non-active area NA to cover the dam DAM and the first inorganic film 131. As the second inorganic film 133 doses not have defects or steps due to the organic film 132 disposed under the second inorganic film 133, a path through which moisture from the outside absorbed into the display device may not be formed. As a result, it is possible to prevent reliability and quality of the display device 10 from deteriorating.

Each of the first inorganic film 131 and the second inorganic film 133 of the encapsulation layer 130 can be formed of silicon nitride, aluminum nitride, zirconium nitride, titanium nitride, hafnium nitride, tantalum nitride, silicon oxide, aluminum oxide, or titanium oxide; however, embodiments of the present disclosure are not limited thereto. The organic film 132 can be formed of acryl resin, epoxy resin, phenolic resin, polyamide resin, or polyimide resin; however, embodiments of the present disclosure are not limited thereto.

The dam DAM can be disposed in the non-active area NA, and can block a flow of the organic film 132 included in the encapsulation layer 130. For example, the dam DAM can be disposed to surround an edge of the active area AA, and can block the flow of the organic film 132 included in the encapsulation layer 130. Further, the dam DAM can be disposed in the non-active area NA and can block the flow of the organic film 132 so that the organic film 132 included in the encapsulation layer 130 cannot reach an exposed pad in the pad portion PAD of the substrate 100. In this manner, the dam DAM can prevent the organic film 132 of the encapsulation layer 130 from being exposed to the outside of the display device 10 or from reaching a pad in the pad portion PAD.

The dam DAM can be formed by depositing a material of the first planarization film 116 or a material of the second planarization film 115, a material of the pixel defining layer 124, and a spacer 141, and then patterning all, or a part of, one or more of these deposited elements. For example, the dam DAM can include a plurality of dams, such as an inner dam DAM1, an outer dam DAM2, an intermediate dam DAM3, and the like. The inner dam DAM1 can be disposed to be adjacent to the active area AA, and disposed to surround an edge of the active area AA. Thus, the inner dam DAM1 can firstly block the flow of the organic film 132 included in the encapsulation layer 130. The outer dam DAM2 can be disposed to surround an edge of the inner dam DAM1, and disposed to be spaced apart from the inner dam DAM1 so that the outer dam DAM2 and the inner dam DAM1 can be parallel to each other. The intermediate dam DAM3 can be additionally located between the inner dam DAM1 and the outer dam DAM2, and thus, can effectively block the flow of the organic film 132. The dam DAM can be a partition, a barrier, or a protrusion, and the like; however, embodiments of the present disclosure are not limited a specific term.

A touch electrode, a polarizing plate, the front member 200, and the like can be disposed on the encapsulation layer 130.

Thus, as the first groove GR1 and the second groove GR2 formed in one or more of the first planarization film 116, the second planarization film 115, and the pixel defining layer 124, each of which is an organic film, can cause gas or moisture remaining in the display device 10 to be discharged, or the movement of the gas or moisture to the light emitting organic material layer 122 to be delayed, it is therefore effectively prevent a phenomenon in which a size of a corresponding emissive layer is shrunk. As a result, it is possible to prevent the reliability and quality of the display device 10 from deteriorating.

Display devices according to the embodiments of the present disclosure can be described as follows.

According to embodiments herein, display devices include a substrate including an active area in which a plurality of pixels are disposed, and a non-active area surrounding the active area, a thin film transistor disposed on the substrate, a first planarization film disposed on the thin film transistor, a first electrode disposed on the first planarization film and electrically connected to the thin film transistor, and a pixel defining layer disposed on the first electrode. Further, the non-active area can include a first groove corresponding to a first region in which one or more of the pixel defining layer and the first planarization film are partially removed, and a second groove corresponding to a second region in which the pixel defining layer is partially removed, where the second region is different from the first region.

According to some embodiments herein, display devices can further include a second planarization film disposed beneath the first planarization film, and an anode connection electrode disposed, and electrically connecting, between the thin film transistor and the first electrode.

According to some embodiments herein, the first groove can be formed by partially removing one or more of the pixel defining layer, the first planarization film, and the second planarization film.

According to some embodiments herein, the second groove can be formed by partially removing one or more of the pixel defining layer, the first planarization film, and the second planarization film.

According to some embodiments herein, the second groove can be disposed to be closer to the active area than the first groove.

According to some embodiments herein, the first and second grooves can be disposed in a left-side region, a right-side region, and an upper region of the substrate.

According to some embodiments herein, the first groove can expose a lateral surface of the first planarization film, and the second groove can expose a part of an upper surface of the first planarization film.

According to some embodiments herein, display devices can further include an emissive layer disposed in a partial region of the first electrode and the pixel defining layer, a second electrode disposed on the emissive layer, a common electrode line for applying a common voltage to the second electrode, and a common electrode connection line for electrically connecting between the second electrode and the common electrode line. In this instance, the second groove can be disposed between the emissive layer and the common electrode connection line.

According to some embodiments herein, the common electrode connection line can include at least one outlet.

According to some embodiments herein, display devices can further include a common electrode connection electrode disposed between the common electrode line and the common electrode connection line, and the common electrode connection electrode can include at least one outlet.

According to embodiments herein, display devices include a substrate including an active area in which a plurality of pixels are disposed, and a non-active area surrounding the active area, a thin film transistor disposed on the substrate, a first planarization film disposed on the thin film transistor, a first electrode disposed on the first planarization film and electrically connected to the thin film transistor, a pixel defining layer disposed on the first electrode, an emissive layer disposed to contact a part of each of the first electrode and the pixel defining layer, a second electrode disposed on the emissive layer, a common electrode line for applying a common voltage to the second electrode, and a common electrode connection line electrically connecting between the second electrode and the common electrode line. In this instance, the non-active area can include a first groove corresponding to a first region in which one or more of the pixel defining layer and the first planarization film are partially removed, and the common electrode connection line can include at least one outlet.

According to some embodiments herein, display devices include a second planarization film disposed beneath the first planarization film, and the first groove can be formed by partially removing one or more of the pixel defining layer, the first planarization film, and the second planarization film.

According to some embodiments herein, the non-active area can further include a second groove formed by partially removing one or more of the pixel defining layer, the first planarization film, and the second planarization film.

According to some embodiments herein, a depth of the first groove and a depth of the second groove can be different from each other.

It will be apparent to those skilled in the art that various modifications and variations can be made in the present disclosure without departing from the technical idea or scope of the disclosures. Thus, it may be intended that embodiments of the present disclosure cover the modifications and variations of the disclosure provided they come within the scope of the appended claims and their equivalents.

What is claimed is:

1. A display apparatus comprising:
  a substrate including a display area in which a plurality of pixels are disposed, and a non-display area surrounding the display area;
  a thin film transistor disposed on the substrate;
  a first planarization film disposed on the thin film transistor;
  a second planarization film disposed under the first planarization film;
  a first electrode disposed on the first planarization film and electrically connected to the thin film transistor;
  a wiring layer disposed in the non-display area, the wiring layer including multiple outlets; and
  a pixel defining layer disposed on the first electrode,
  wherein the wiring layer includes:
    a common electrode line, and
    a common electrode connection line including the multiple outlets,
  wherein the non-display area includes:
    a dam disposed to surround the display area,
    a first groove formed in a first region of the non-display area, the first groove including a first hole extending through both of the pixel defining layer and the first planarization film, and
    a second groove formed in a second region of the non-display area, the second groove including a second hole extending through the pixel defining layer, the second region being different from the first region,
  wherein a plurality of outlets among the multiple outlets in the wiring layer are located on opposite sides of the first groove,
  wherein the first groove and the second groove are located between the dam and the display area, and
  wherein the common electrode connection line directly contacts a side surface of the second planarization film, an upper surface of the second planarization film, a side surface of the first planarization film and an upper surface of the first planarization film.

2. The display apparatus according to claim 1, further comprising:
  an anode connection electrode disposed between the thin film transistor and the first electrode and electrically connecting the thin film transistor to the first electrode.

3. The display apparatus according to claim 2, wherein the first groove is formed in a region in which the pixel defining layer, the first planarization film, and the second planarization film are partially removed.

4. The display apparatus according to claim 2, wherein a width of the first groove is larger than a width of the second groove.

5. The display apparatus according to claim 1, wherein the second groove is disposed to be closer to the display area than the first groove.

6. The display apparatus according to claim 1, wherein the first and second grooves are disposed at a left region, a right region, and an upper region of the substrate.

7. The display apparatus according to claim 1, wherein the first groove exposes a lateral surface of the first planarization film to an outside, and the second groove exposes a part of a top surface of the first planarization film to the outside.

8. The display apparatus according to claim 1, further comprising:
  an emissive layer disposed at a partial region of the first electrode and the pixel defining layer;
  a second electrode disposed on the emissive layer; and
  a common electrode line configured to apply a common voltage to the second electrode,
  wherein the wiring layer includes a common electrode connection line configured to electrically connect between the second electrode and the common electrode line, and
  wherein the second groove is disposed between the emissive layer and the common electrode connection line.

9. The display apparatus according to claim 8, wherein the common electrode connection line includes at least one outlet among the multiple outlets.

10. The display apparatus according to claim 8, further comprising a common electrode connection electrode disposed between the common electrode line and the common electrode connection line,
  wherein the common electrode connection electrode includes at least one outlet among the multiple outlets.

11. A display apparatus comprising:
  a substrate including a display area having a plurality of pixels, and a non-display area surrounding the display area;
  a thin film transistor disposed on the substrate;
  a first planarization film disposed on the thin film transistor;
  a second planarization film disposed under the first planarization film;
  a first electrode disposed on the first planarization film and electrically connected to the thin film transistor;
  a pixel defining layer disposed on the first electrode;
  an emissive layer disposed in a partial region of the first electrode and the pixel defining layer;
  a second electrode disposed on the emissive layer;
  a common electrode line configured to apply a common voltage to the second electrode; and
  a common electrode connection line configured to electrically connect between the second electrode and the common electrode line, the common electrode connection line including multiple outlets,
  wherein the non-display area includes:
    a dam disposed to surround the display area, and
    a first groove formed in a first region of the non-display area, the first groove including a first hole extending through both of the pixel defining layer and the first planarization film,
  wherein a plurality of outlets among the multiple outlets in the common electrode connection line are located on opposite sides of the first groove,
  wherein the first groove is located between the dam and the display area, and wherein the common electrode connection line directly contacts a side surface of the second planarization film, an upper surface of the second planarization film, a side surface of the first planarization film and an upper surface of the first planarization film.

12. The display apparatus according to claim 11, wherein the first groove is formed in a region in which the pixel defining layer, the first planarization film, and the second planarization film are partially removed.

13. The display apparatus according to claim 12, further comprising a second groove formed in a second region of the non-display area, the second groove including a second hole extending through the pixel defining layer.

14. The display apparatus according to claim 13, wherein a depth of the first groove and a depth of the second groove are different from each other.

15. A display apparatus, comprising:
a substrate including a first area having a plurality of pixels and a second area surrounding the first area and being a non-display area;
a thin film transistor disposed over the substrate;
a first planarization film disposed on the thin film transistor;
a second planarization film disposed under the first planarization film;
a first electrode disposed on the first planarization film and electrically connected to the thin film transistor;
a wiring layer disposed in the second area, the wiring layer including multiple outlets; and
a pixel defining layer disposed on the first electrode,
wherein the wiring layer includes:
a common electrode line, and
a common electrode connection line including the multiple outlets,
wherein the second area includes:
a dam disposed to surround the first area,
a first groove formed in a first region of the second area, the first groove including a first hole extending through the pixel defining layer, the first planarization film, and the second planarization film, and
a second groove formed in a second region of the second area, the second groove including a second hole extending through the pixel defining layer, the second region being different from the first region,
wherein a plurality of outlets among the multiple outlets in the wiring layer are located on opposite sides of the first groove,
wherein the first groove and the second groove are located between the dam and the first area, and
wherein the common electrode connection line directly contacts a side surface of the second planarization film, an upper surface of the second planarization film, a side surface of the first planarization film and an upper surface of the first planarization film.

16. The display apparatus according to claim 15, wherein the second groove is disposed to be closer to the first area than the first groove.

17. The display apparatus according to claim 13, wherein the common electrode connection line extends along a side surface of the second planarization film, an upper surface of the second planarization film, a side surface of the first planarization film and an upper surface of the first planarization film.

18. The display apparatus according to claim 1, wherein the first groove and the second groove extend around one or more corners of the display area.

19. The display apparatus according to claim 1, wherein the first groove and the second groove surround at least three sides of the display area.

20. The display apparatus according to claim 2, wherein the wiring layer is disposed on the first planarization film and the second planarization film, and
wherein the multiple outlets of the wiring layer disposed on the first planarization film and the second planarization film are covered by the pixel defining layer.

21. The display apparatus according to claim 12, wherein the wiring layer is disposed on the first planarization film and the second planarization film, and
wherein the multiple outlets of the wiring layer disposed on the first planarization film and the second planarization film are covered by the pixel defining layer.

* * * * *